United States Patent
Hsieh et al.

(10) Patent No.: US 6,764,965 B2
(45) Date of Patent: Jul. 20, 2004

(54) METHOD FOR IMPROVING THE COATING CAPABILITY OF LOW-K DIELECTRIC LAYER

(75) Inventors: Tsung-Tang Hsieh, Taipei (TW); Cheng-Yuan Tsai, Yun-Lin (TW); Chih-An Huang, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 116 days.

(21) Appl. No.: 09/931,016

(22) Filed: Aug. 17, 2001

(65) Prior Publication Data

US 2003/0036290 A1 Feb. 20, 2003

(51) Int. Cl.$^7$ ................................................ H01L 21/31
(52) U.S. Cl. ........................ 438/782; 438/780; 438/781; 438/789; 438/790; 427/489; 427/503; 427/579
(58) Field of Search ................................ 438/780, 781, 438/782, 789, 790; 427/489, 503, 579

(56) References Cited

U.S. PATENT DOCUMENTS

| | | | | | |
|---|---|---|---|---|---|
| 4,692,398 A | * | 9/1987 | Durham | ...................... | 430/329 |
| 4,806,458 A | * | 2/1989 | Durham | ...................... | 430/331 |
| 5,962,621 A | * | 10/1999 | Beckerdite et al. | ......... | 528/176 |
| 5,998,103 A | * | 12/1999 | Zhang | ...................... | 427/207.1 |
| 6,245,690 B1 | * | 6/2001 | Yau et al. | .................... | 438/781 |

* cited by examiner

*Primary Examiner*—Kamand Cuneo
*Assistant Examiner*—Lisa Kilday

(57) ABSTRACT

A method for improving the coating capability of low dielectric layer is disclosed. The method includes steps of an etching stop layer is deposited a semiconductor substrate, an adhesion promoter layer is spun-on the etching stop layer. The pre-wetting process being performed on the adhesion promoter layer to enhance the coating capability of the low-k dielectric layer, and thus improve the coating quality through the pre-wetting process of baked adhesion promoter layer before the low-k dielectric layer is applied.

17 Claims, 2 Drawing Sheets

METHOD FOR IMPROVING THE COATING CAPABILITY OF LOW-K DIELECTRIC LAYER

BACKGROUND OF THE INVENTION

1. Field of the Invention

The present invention generally relates to a method for improving the coating capability of the low-k dielectric layer, and more particularly to a method for improving coating quality through the pre-wetting process of the baked adhesion promoter layer.

2. Description of the Prior Art

Through advanced semiconductor process in techniques, integrated circuit devices with sub-micron and sub-half-micron features sizes can now be manufactured. This trend toward deep sub-micron technology (i.e., involving feature sizes less than 0.35 microns) has, in turn, driven the need for multilevel interconnect. As a result, circuit performance in the deep sub-micron regime is increasingly a function of the delay time of electronic signals traveling between the millions of gates and transistors presented on the typical integrated circuit chip. Parasitic capacitance and resistance effects resulting from these otherwise passive interconnect structures must therefore be well controlled. Toward this end, recent research emphasizes the use of low resistance metals (e.g., copper) in conjunction with insulating material with low dielectric constant (low-k dielectrics) between metal lines. Low-k dielectric meaning that is a dielectric material, which exhibits a dielectric constant, substantially less than conventional dielectric materials such as silicon dioxide, silicon nitride, and silicon oxynitride. Silicon dioxide, for example, has a dielectric constant of about 4.0. Copper is desirable in that its conductivity is relatively high and it is relatively high resistance of electromigration than many metals (for example, aluminum).

Modern semiconductor processing techniques increasingly employ Chemical-Mechanical Polishing (CMP) in the fabrication of interconnect layers, particularly where the number of layers rises above three and the conductive lines themselves are characterized by a high aspect ratio (e.g., lines on the order of 0.25 $\mu$m width and on the order of 1.0 $\mu$m in height).

In high performance integrated circuits in the sub-0.25 $\mu$m regime, there is a need to fabricate interconnects using so-called damascene techniques. This is because conventional deposition and etching of aluminum-based metallization becomes increasingly difficult at these feature sizes. At the same time, performance considerations call for the use of lower resistivity metals such as copper, which has proven virtually impossible to pattern by using conventional reactive ion etching. Thus, the use of copper for interconnects is of great importance using an attractive damascene techniques and spurred investigation into improving these techniques.

As the dimension of integrated circuit continues to shrink, specific polymeric materials become eminent candidates to be used as inter-layer dielectric (ILD) due to their intrinsic low dielectric constant (k), which is essential for 0.13-micrometer generation and below. They have to be applied through a spin-on coating process and a surfactant material is called adhesion promoter, which is often used to facilitate the coating process and also reinforce the adhesion between the coated low k polymer film and the underlayer, generally, the silicon nitride or silicon carbide.

In this invention, the adhesion promoter layer with thickness about 100 angstroms is coated onto a wafer such as M2 (metal 2) wafer with an etching stop layer and then baked at 150° C. for 120 seconds, wherein the etching stop layer is an inorganic material. The organic polymeric low-k dielectric layer such as SiLK of approximately 3000 angstroms thick is spun-on the wafer, after the wafer is chilled at a 23° C. chill plate for 60 seconds and subsequently baked at 300° C. for 100 seconds. Although the baking step of the adhesion promoter layer can lead to favorable bonding with the underlying etching stop layer, the baked dried surface of the adhesion promoter layer does not facilitate the coating of low-k dielectric material (SiLK).

It is often observed that coating defects appear at the periphery where the coating windows are the most critical if the pre-wetting step is not applied.

According to the above-mentioned description, a method is needed for improving the wettability of adhesion promoter so that a flawless coating of low-k dielectric film can be obtained.

SUMMARY OF THE INVENTION

The object of this invention is to utilize a solvent to improve the wettability for adhesion promoter layer.

The other object of this invention is to provide a method to improve the coating quality through the pre-wetting process of adhesion promoter layer.

The other object of this invention is to provide a method for improving the coating capability of low-k dielectric layer.

According to the objects of above-mentioned, in the preferable embodiment, in order to improve the coating capability of the low-k dielectric layer, the method is provided to use an adhesion promoter layer spun-on coating between the inorganic etching stop layer and low-k dielectric layer, and a pre-wetting process is performed on the adhesion promoter layer to enhance the coating quality when the low-k dielectric layer is spun-on the wafer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
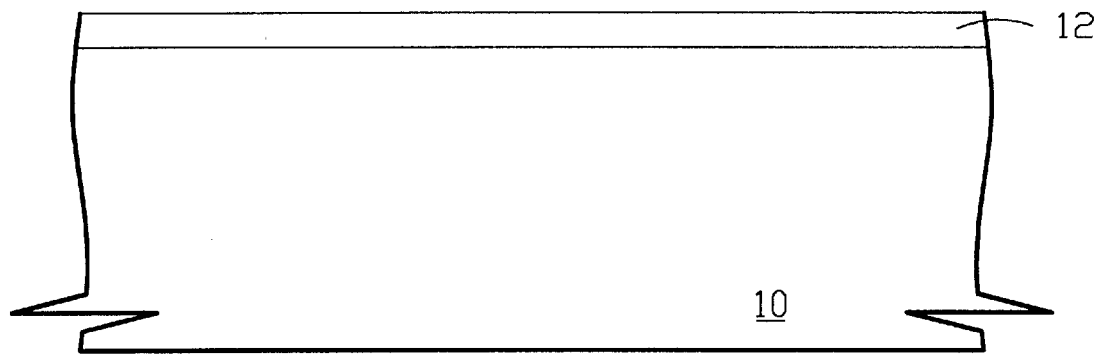
FIG. 1 is a cross-sectional view showing an etching stop layer formed on substrate in accordance with a method disclosed.

The following processes are performed in a coating chamber with relative humidity about 30 percent to 60 percent, preferably 35 percent to 45 percent, and the temperature can be in the range of about 20° C. to 30° C., preferably 23° C. to 27° C. Referring to FIG. 1, an etching stop layer 12, formed on a substrate 10, is utilized as a layer for stop etching at following etching process. Material of the etching stop layer 12 can be inorganic dielectric material, such as SiN (silicon nitride) or SiC (silicon carbide) and formation of the layer is conventional CVD method (chemical vapor deposition method), wherein the substrate 10 can be M2 (metal 2) wafer. SiC with a lower dielectric constant and a better resistance of copper diffusion in comparison with conventional SiN in interconnects structure or in a single or dual damascene structure, is a viable candidate in company with low-k materials for advanced generation.

Figure 2:
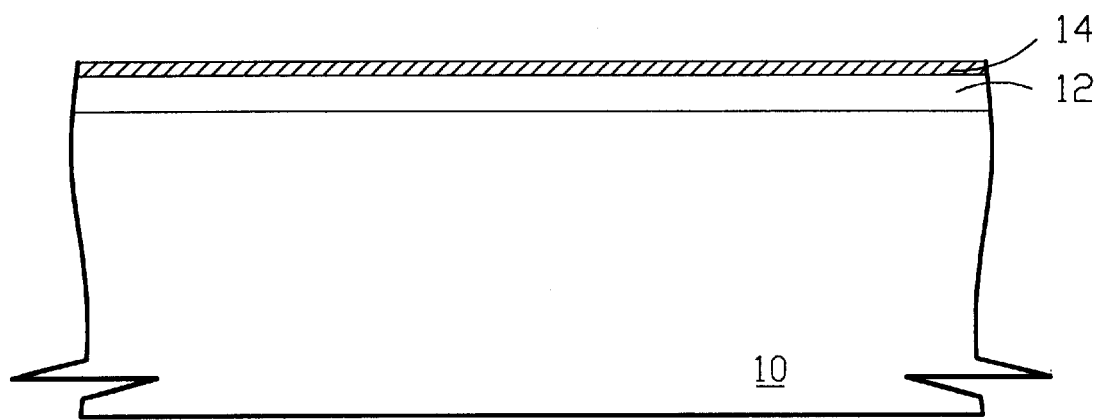
FIG. 2 is a cross-sectional view showing an adhesion promoter layer formed on the structure of FIG. 1 in accordance with a method disclosed.

Referring to FIG. 2, an adhesion promoter layer 14 is spun-on coating on the etching stop layer 12. The adhesion promoter layer 14 has a silicon single bond (silicon—) and unsaturated organic segment containing chemicals such as vinyltriacetoxysilane (AP 4000 ™) from Dow Chemical. The thickness of adhesion promoter layer 14 is about 100 angstroms. The adhesion promoter layer 14 is a surfactant-like material and is often used to facilitate the coating process and also reinforce the adhesion between the low-k dielectric layer 16 and the etching stop layer 12, wherein the material of low-k dielectric layer 16 is organic polymeric.

Then, in order to anchor the molecules of adhesion promoter layer 14 with the substrate 10, the coated adhesion promoter layer 14 has to undergo baking process to induce the required chemical reaction. However, the baking process leads to most of the removal of the solvent within, if not all. The temperature of the baking process is about 100° C. to 200° C., preferably 150° C. to 180° C. for 120 seconds. A dry adhesion promoter layer 14 surface is not a favorable condition for the subsequent coating of low-k dielectric layer 16. In a preferable embodiment, a procedure is provided to not only retain the necessary bonding between adhesion promoter layer 14 and substrate 10 but also condition the adhesion promoter layer 14 surface by wetting the baked adhesion promoter layer 14 with a solvent.

Next, in one embodiment, the wafer is chilled at a temperature about 23° C. for 30 seconds, after the baking process. Then, a nozzle dispenses pre-wetting solvent of 1 milliliter (mL) within 1.5 seconds with the wafer being in a static state. Then, the wafer is spun-dry to remove the excessive solvent remaining on the wafer by accelerating to 2000 rpm (revolutions per minute) for 0.5 second at an acceleration of 10000 $rpm^2$. The solvent employed can be 1,3,5-trimethyl benzene (mesitylene) or propylene glycol monomethyl ether acetate (PGMEA).

In another embodiment, the wafer is also chilled at temperature about 23° C. for 30 seconds, after the baking process. Then, a nozzle dispenses solvent of 1 mL within 1.5 seconds with the wafer in a rotation state at speed of about 2000 rpm. Then, the wafer is spun-dry to remove the excessive solvent which is remaining on the wafer by decelerating to 0 rpm for 1 second at a deceleration of 10000 $rpm^2$ and accelerating to 2000 rpm for another 0.5 second.

Figure 3:
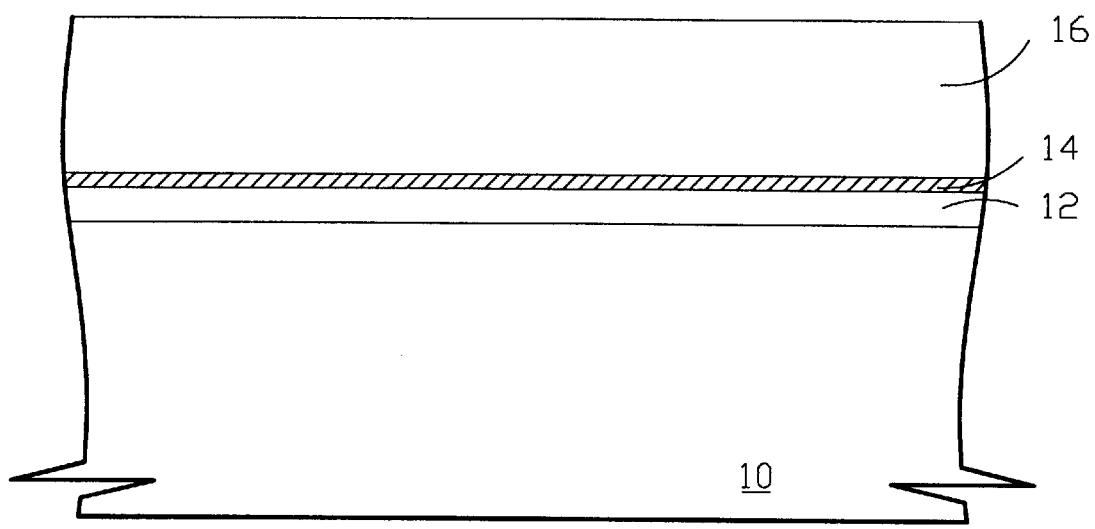
FIG. 3 is a cross-sectional view showing a low dielectric layer formed the structure of FIG. 2 after pre-wetting process and baking process in accordance with a method disclosed.

Referring to FIG. 3, a low-k dielectric layer 16 is spun-on coating on the adhesion promoter layer 14. The material of low-k dielectric layer 16 is an organic polymeric material such as SiLK from Dow Chemical. The dielectric constant of SiLK is about 2.6 to 2.7 and the thickness of low-k dielectric layer 16 is about 3000 angstroms. Then, the wafer is subsequently baked at a temperature about 300° C. for 100 seconds, after the low-k dielectric layer 16 is spun-on coating on the adhesion promoter layer 14.

According to above-mentioned, in order to improve the coating capability of the low-k dielectric layer, the method is provided to use an adhesion promoter layer spun-on coating between the etching stop layer and low-k dielectric layer, and a pre-wetting process is performed on the adhesion promoter layer to enhance its wettability before the low-k dielectric layer is coated on the wafer.

Although specific embodiments have been illustrated and described, it will be obvious to those skilled in the art that various modifications may be made without departing from what is intended to be limited solely by the appended claims.

What is claimed is:

1. A method for improving the wettability of adhesion promoter layer, said method comprising:

providing an adhesion promoter layer on a substrate, wherein said adhesion promoter layer is a surfactant material;

baking said adhesion promoter layer such that the solvent within said adhesion promoter layer is to be removed; and pre-wetting said adhesion promoter layer with a solvent such that the wettability of the surface of said adhesion promoter layer is enhanced.

2. The method according to claim 1, wherein said solvent of pre-wetting said adhesion promoter layer comprises 1,3,5-trimethyl benzene.

3. The method according to claim 2, wherein said solvent of said pre-wetting said adhesion promoter layer comprises propylene glycol monomethyl ether acetate.

4. The method according to claim 3, further comprising a nozzle dispenses said solvent to the wafer, wherein said wafer is in a static state.

5. The method according to claim 4, further comprising a nozzle dispenses said solvent to the wafer, wherein said wafer is in a dynamic rotation state.

6. A method for improving the coating quality through the pre-wetting process of adhesion promoter layer, said method comprising:

spinning-on an adhesion promoter layer on a semiconductor substrate, wherein the characteristic of said adhesion promoter layer is a surfactant material;

baking said adhesion promoter layer such that the solvent within said adhesion promoter layer is to be removed; and pre-wetting said adhesion promoter layer such that the wettability of the surface of said adhesion promoter layer is enhanced.

7. The method according to claim 6, wherein said solvent of pre-wetting said adhesion promoter layer comprises 1,3,5-trimethyl benzene.

8. The method according to claim 7, wherein said solvent of pre-wetting said adhesion promoter layer comprises propylene glycol monomethyl ether acetate.

9. The method according to claim 8, further comprising a nozzle dispenses said solvent to the wafer, wherein said wafer is in a static state.

10. The method according to claim 9, further comprising a nozzle dispenses said solvent to the wafer, wherein said wafer is in a dynamic rotation state.

11. The method according to claim 6, further comprising a low-k dielectric layer is spun-on said adhesion promoter layer.

12. A method for improving the coating capability of the low-k dielectric layer, said method comprising:

provinding a substrate and an etching stop layer thereon;

spinning-on an adhesion promoter layer on said etching stop layer;

baking said adhesion promoter layer so that the solvent within said adhesion promoter layer is removed and bonding with underlying etching stop layer formed;

pre-wetting said adhesion promoter layer with solvent so that the wettability of the surface of said adhesion promoter layer is enhanced; and spinning-on an organic polymeric low-k dielectric layer on said adhesion promoter layer.

13. The method according to claim 12, wherein said solvent of pre-wetting said adhesion promoter layer comprises 1,3,5-trimethyl benzene.

14. The method according to claim 13, wherein said solvent of pre-wetting said adhesion promoter layer comprises propylene glycol monomethyl ether acetate.

15. The method according to claim 14, further comprising a nozzle dispenses said plasticizer solvent to the wafer, wherein said wafer is in a static state.

16. The method according to claim 15, further comprising a nozzle dispenses said plasticizer solvent to the wafer, wherein said wafer is in a dynamic rotation state.

17. The method according to claim 12, further comprising a spin-dry process after said pre-wetting said adhesion promoter layer.

* * * * *